(12) United States Patent
Cheng et al.

(10) Patent No.: US 12,344,929 B2
(45) Date of Patent: Jul. 1, 2025

(54) MULTI-FUNCTIONAL SHUTTER DISK FOR THIN FILM DEPOSITION CHAMBER

(71) Applicant: Taiwan Semiconductor Manufacturing Co., Ltd., Hsinchu (TW)

(72) Inventors: Wen-Hao Cheng, Taichung (TW); Yen-Yu Chen, Taichung (TW); Yi-Ming Dai, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/424,531

(22) Filed: Jan. 26, 2024

(65) Prior Publication Data

US 2024/0167149 A1    May 23, 2024

Related U.S. Application Data

(62) Division of application No. 17/869,174, filed on Jul. 20, 2022, now Pat. No. 11,920,237, which is a division of application No. 16/657,832, filed on Oct. 18, 2019, now Pat. No. 11,492,700.

(51) Int. Cl.
*C23C 16/02* (2006.01)
*C23C 14/02* (2006.01)
*C23C 14/34* (2006.01)
*C23C 16/34* (2006.01)
(Continued)

(52) U.S. Cl.
CPC ........ *C23C 16/0245* (2013.01); *C23C 14/021* (2013.01); *C23C 14/34* (2013.01); *C23C 16/34* (2013.01); *C23C 16/4583* (2013.01); *C23C 16/463* (2013.01); *H01L 2224/77185* (2013.01)

(58) Field of Classification Search
CPC ... C23C 16/0245; C23C 14/021; C23C 14/34; C23C 16/34; C23C 16/4583; C23C 16/463; C23C 14/541; C23C 14/564; C23C 14/3471; C23C 14/568; H01L 2224/77185

See application file for complete search history.

(56) References Cited

U.S. PATENT DOCUMENTS

| 11,127,574 B2 | 9/2021 | Kawamata et al. |
| 2010/0089315 A1* | 4/2010 | Brown ................ H01L 21/6719 118/504 |
| 2019/0345606 A1 | 11/2019 | Hwang et al. |

FOREIGN PATENT DOCUMENTS

| JP | 2001107251 A | * | 4/2001 |
| TW | I626327 B | | 6/2018 |

(Continued)

*Primary Examiner* — Ermias T Woldegeorgis
(74) *Attorney, Agent, or Firm* — Seed IP Law Group LLP

(57) ABSTRACT

The present disclosure provides a multifunction chamber having a multifunctional shutter disk. The shutter disk includes a lamp device, a DC/RF power device, and a gas line on one surface of the shutter disk. With this configuration, simplifying the chamber type is possible as the various specific, dedicated chambers such as a degas chamber, a pre-clean chamber, a CVD/PVD chamber are not required. By using the multifunctional shutter disk, the degassing function and the pre-cleaning function are provided within a single chamber. Accordingly, a separate degas chamber and a pre-clean chamber are no longer required and the overall transfer time between chambers is reduced or eliminated.

20 Claims, 4 Drawing Sheets

(51) Int. Cl.
*C23C 16/458* (2006.01)
*C23C 16/46* (2006.01)

(56) References Cited

FOREIGN PATENT DOCUMENTS

TW 201838486 A 10/2018
TW I652364 B 3/2019

* cited by examiner

MULTI-FUNCTIONAL SHUTTER DISK FOR THIN FILM DEPOSITION CHAMBER

BACKGROUND

In manufacturing semiconductors, a process chamber or process chamber system is used to maximize the throughput rate as measured in wafers per hour (WPH). The wafers go through various steps within each chamber of the process chamber system to process the wafers to manufacture semiconductors, integrated circuits, microprocessors, memory chips or the like. These chambers include degas chambers, pre-clean chambers, cooling chambers, chemical vapor deposition (CVD) chambers, and physical vapor deposition (PVD) chambers. A transfer system capable of transferring wafers between chambers assists in reducing the bottleneck of the manufacturing process by efficiently transferring the wafers between each chamber performing different functions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
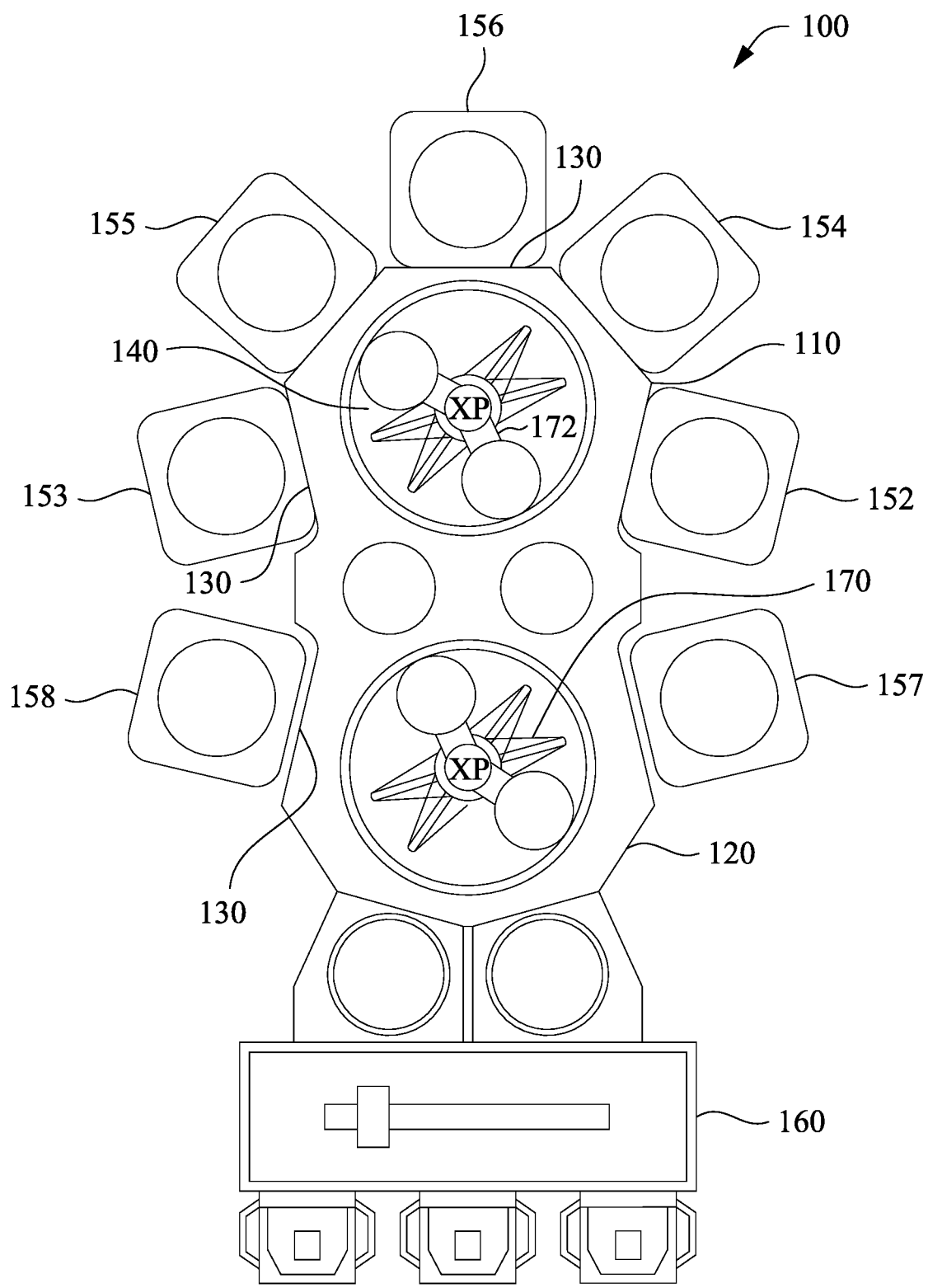
FIG. 1 is a plan view of one embodiment of a process chamber system including a multifunctional chamber having a multifunctional shutter disk in accordance with embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly.

The various aspects of the present disclosure will be now detailed in connection with the figures.

FIG. 1 is a plan view of one embodiment of a multifunctional chamber having a multifunctional shutter disk in accordance with embodiments of the present disclosure.

In the embodiment of FIG. 1, a chamber process system 100 includes one or more pentagonal main frames 110, 120 having a plurality of sidewalls 130. A plurality of vacuum load lock chambers 140 is located in the center of pentagonal main frames 110, 120. A plurality of chambers, 152, 153, 154, 155, 156, 157 and 158 are positioned adjacent to each sidewall 130 of the vacuum load lock chambers 140.

An external workpiece elevator 160 is located adjacent to the chamber process system 100. The external workpiece elevator 160 is configured to hold a plurality of workpieces (e.g., wafers, substrates, or the like) and supply the workpieces into the chamber process system 100 for processing. The external workpiece elevator 160 may include a cassette for containing a plurality of workpieces and an automatic distributor for selecting the workpieces from the cassette and timely supplying the selected workpieces to the vacuum load lock chambers 140 and into the plurality of chambers 152, 153, 154, 155, 156, 157 and 158.

In one or more embodiments, the vacuum load lock chamber 140 is maintained in a vacuum state. The vacuum load lock chamber 140 delivers a workpiece to one of the plurality of chambers 152, 153, 154, 155, 156, 157 or 158 and loads the workpiece into a selected chamber. After the loading process, the vacuum load lock chamber 140 spatially separates or locks the vacuum load lock chamber 140 from at least one of the plurality of chambers 152, 153, 154, 155, 156, 157, 158 during processing. The vacuum load lock chamber 140 includes a wafer transfer system 170 for transferring the workpiece from the external workpiece elevator 160 to the plurality of chambers 152, 153, 154, 155, 156, 157 and 158. The wafer transfer system 170 also transfers the workpiece between the chambers 152, 153, 154, 155, 156, 157 and 158 depending on the next step of the overall manufacturing process. The wafer transfer system 170 may include a plurality of robotic arms 172 for moving the workpiece.

In a related chamber processing system, the pre-clean process, the degas process, the cooling process, the deposition process are each performed in separate, dedicated chambers. That is, in a related system, there are a separate degas chamber, pre-clean chamber, chemical vapor deposition (CVD) chamber, physical vapor deposition (PVD) chamber and cooling chamber, in which each chamber is used for one specific and distinct process. Typically in the related chamber processing system, an external workpiece elevator retrieves the workpiece and provides it to a dedicated chamber for the degassing process, and after the degassing process, the system provides the workpiece to another chamber for the pre-cleaning process, and thereafter provides the workpiece to another chamber for the PVD or CVD process. The transfer time involved in moving the workpiece from the degas chamber to the pre-clean chamber and to the film deposition chamber contributes significantly to the overall processing time for degassing, pre-cleaning, and depositing a film on the workpiece in the related system.

In accordance with one or more embodiments of the present disclosure, one or more of the plurality of chambers 152, 153, 154, 155, 156, 157, 158 is a multifunctional chamber capable of performing at least a degas process, a pre-clean process, and a deposition process. In accordance with the present disclosure, such a multifunctional chamber includes a multifunctional shutter disk capable of performing the degas process and the pre-clean process unlike related shutter disks in the art which are unable to perform a degas process or a pre-clean process. Using a shutter disk capable of performing a degas process and a pre-clean process allows one or more chambers of the plurality of chambers 152, 153, 154, 155, 156, 157, 158 to function as a multifunctional chamber when equipped with a multifunction shutter disk in accordance with embodiments of the present disclosure. The benefit of a multifunctional chamber is that it avoids the need to transfer a workpiece to different chambers to carry out processes that are carried out in the multifunctional chamber. Avoiding such transfers substantially reduces the transfer time from one chamber to another chamber, which reduces the overall time for completion of the film deposition process. In addition, use of a multifunctional chamber reduces or eliminates the need for a separate, dedicated degas chamber and pre-clean chamber. These unneeded degas and pre-clean chambers can be replaced with multifunctional chambers which thereby increases the overall throughput rate of the chamber process system 100. The details of the multifunctional shutter disk are described in connection with the following figures.

Figure 2:
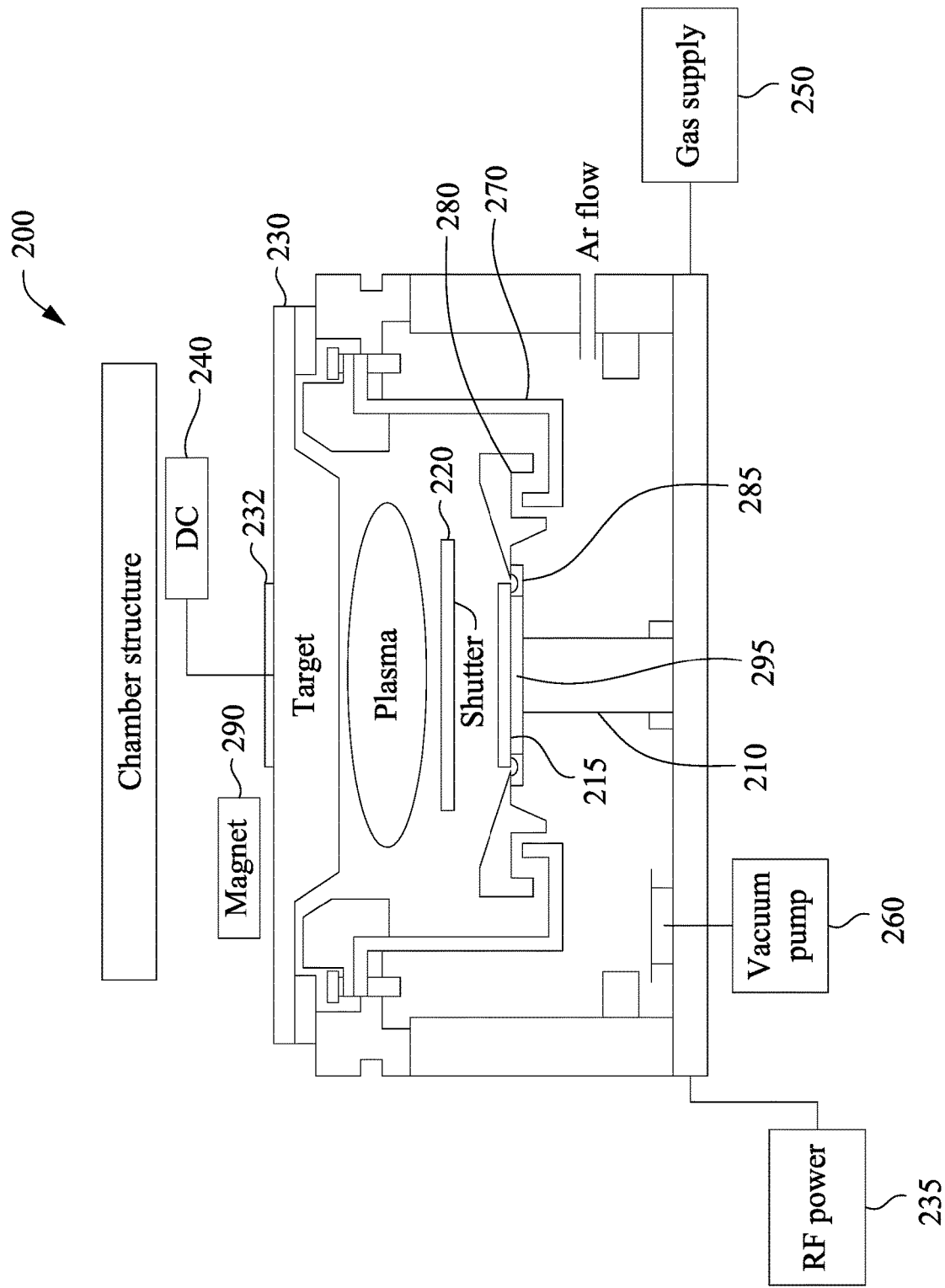
FIG. 2 is a cross-sectional view of a multifunctional chamber structure including a multifunctional shutter disk according to one embodiment of the present disclosure.

FIG. 2 is a cross-sectional view of a multifunctional chamber structure 200 according to one embodiment of the present disclosure. The chamber 200 includes a workpiece support 210 (or a holder 210) upon which a workpiece 215 is placed during processing. The workpiece support 210 is, for example, fabricated from aluminum, stainless steel, ceramic or combinations thereof. A shutter disk 220 is positioned above the workpiece 215. Generally, a shutter disk 220 is used during cleaning of a target 230 to protect the workpiece support 210 and other components adjacent and around the workpiece support 210. For example, the shutter disk 220 is positioned between the target 230 and the workpiece support 210 to isolate the target 230 and other components to be cleaned during the cleaning process from other components within the chamber 200 which could be damaged by cleaning of the target 230 and pasting materials. In one embodiment, the shutter disk 220 is housed in an enclosure (not shown) attached to the side of the chamber 200 based on the type of operations being performed. The shutter disk 220 is connected to a rotating arm for moving the shutter disk 220 in a horizontal direction or a vertical direction based on the stage and type of the operation (e.g., pre-cleaning, degassing, or other suitable steps involved in manufacturing). For example, based on the operation, the rotating arm may place the shutter disk 220 to overlie the workpiece 215 (or overlie the workpiece support 210) or may otherwise place the shutter disk 220 inside the enclosure.

In one embodiment, an RF power circuit 235 is connected to the workpiece support 210 to provide an RF bias voltage to the workpiece 215 during processing. In another embodiment, the RF power circuit 235 is connected to the shutter disk 220 and provides RF power to the shutter disk 220 during processing.

In one embodiment, a DC power circuit 240 is connected to the shutter disk 220 and provides DC power to the shutter disk 220. In another embodiment, the DC power circuit 240 provides a DC bias to the workpiece 215. In further embodiments, the DC power circuit 240 is connected to the target 230 and provides the target 230 with a DC bias voltage. For example, in some embodiments in accordance with the present disclosure, the target 230 and the workpiece support 210 are biased relative to each other by a power source (DC or RF). In other embodiments, an electrode 232 coupled to the target 230 and the DC power circuit 240 may be provided. The electrode 232 may be biased with a DC bias during the deposition process.

In one embodiment of the present disclosure, a gas supply 250 is connected to the shutter disk 220 and supplies a gas to the shutter disk 220. The supplied gas is useful during a degas process, a pre-clean process, or a deposition process. In another embodiment, the gas supply 250 controls the gas flow into the chamber 200. For example, the gas supply 250 may provide the argon (Ar) gas into the chamber 200. In further embodiments, various gases may be supplied to the chamber 200 through the gas supply 250 during etch cleaning, such as hydrogen, oxygen, fluorine-containing gases or inert gases such as argon, depending on the materials to be removed.

A vacuum pump 260 is connected to the chamber 200. The vacuum pump 260 is capable of creating a vacuum state in the chamber 200 during processing of the workpiece 215. A shielding 270 surrounds the workpiece 215 during processing and a cover ring 280 maintains the workpiece 215 against the workpiece support 210 during processing.

The target 230 provides material to be deposited on the workpiece 215 during, for example, a PVD process. A magnet 290 enhances uniform consumption of the target material during processing. A plasma is formed between the target 230 and the workpiece 215 from the gas supplied, such as Ar. Ions within the plasma are accelerated toward the target 230 and bombard the target 230 to remove portions of the target material by dislodging portions of the material from the target 230. The dislodged target material is attracted towards the workpiece 215 due to the voltage bias and deposits a film of target material on the workpiece 215 (which is generally negatively biased).

A deposition ring 285 surrounds the workpiece support 210. A cover ring 280 positioned adjacent to the deposition ring 285 partially overlaps the deposition ring 285. The cover ring 280 is supported by the deposition ring 285. The cover ring 280 and the deposition ring 285 protect the regions of the workpiece support 210 that are not covered by the workpiece 215 during processing (e.g., sputtering process or PVD process). The rest of the chamber 200 is protected by the shielding 270 that is adjacent to the cover ring 280. The cover ring 280 and the deposition ring 285 reduce or minimize materials from the target 230 depositing on the workpiece support 210. During a PVD process, the Ar gas in the chamber 200 is turned into a plasma state. That is, the plasma will have positive Ar ions and electrons. The positive Ar ions will be attracted towards the negative plate where the target 230 is located (e.g., the target 230 may be negatively biased using the DC power circuit 240). This attraction force causes the positive Ar ions to move towards the negative plate where the target 230 is located. These ions impact the target 230 with force during the process. This force causes some atoms from the target surface to be dislodged from the target 230 and eventually deposit onto the workpiece 215. If some of the dislodged materials from the target 230 comes in contact with the workpiece support 210 and its surroundings (e.g., walls of the workpiece support 210 and the periphery of the workpiece 215), dislodged materials can deposit onto the workpiece support 210, its surroundings or the periphery of the workpiece 215. The cover ring 280 and the deposition ring 285 cooperate to reduce or eliminate materials from the target 230 from coming in contact with components of the chamber 200 upon which deposition of the target material is undesired.

The deposition ring 285 can be removed to clean these target material deposits from the surfaces of the deposition ring 285. By employing the deposition ring 285, the workpiece support 210 does not have to be dismantled to be cleaned after every PVD process. In addition, the deposition ring 285 protects the edge or periphery surfaces of the workpiece support 210 to reduce their erosion by the energized plasma. In one embodiment, the deposition ring 285 can be formed with a ceramic material, such as aluminum oxide. However, other materials may be used such as synthetic rubbers, thermoset, plastic, thermoplastics or any other material that meets the chemical compatibility, durability, sealing requirements, application temperature, etc. For example, the ceramic material may be molded and sintered using known technologies such as isostatic pressing, followed by machining of the molded sintered preform using suitable machining methods to achieve the shape and dimensions required. However, other known techniques for manufacturing may be used.

In one embodiment, the cover ring 280 is fabricated from a material that can resist erosion by the generated plasma, for example, a metallic material such as stainless steel, titanium or aluminum, or a ceramic material, such as aluminum oxide. However, other suitable materials may be used such as synthetic rubbers, thermoset, plastic, thermoplastics or any other material that meets the chemical compatibility, durability, sealing requirements, application temperature, etc.

In accordance with embodiments of the present disclosure, a heater 295 is provided on the workpiece support 210. During operation, the workpiece 215 is placed on top of the heater 295 that is arranged on a top surface of the workpiece support 210. In one embodiment, the heater 295 may be incorporated as a single, integrated structure as the workpiece support 210. In other embodiments, the heater 295 may be a separate component that is overlain on top surface of the workpiece support 210. The heater 295 is designed to heat the workpiece 215 to prepare the workpiece 215 for processing.

While not shown in the figures, a controller circuit is connected to the chamber 200 to perform and execute the various steps of the manufacturing process. Typically, a controller circuit includes microprocessor, central processing unit, and any other integrated circuit capable of performing instructions. In one embodiment, the controller circuit may control various chambers, robotic arms 172 of the wafer transfer system 170, and various sub-processors incorporated within the chamber process system 100. Further components such as memory may be coupled to the controller circuit. The memory or computer-readable medium may be one or more of readily available memory such as random access memory (RAM), read only memory (ROM), hard disk, or any other form of digital storage, local or remote.

Figure 3:
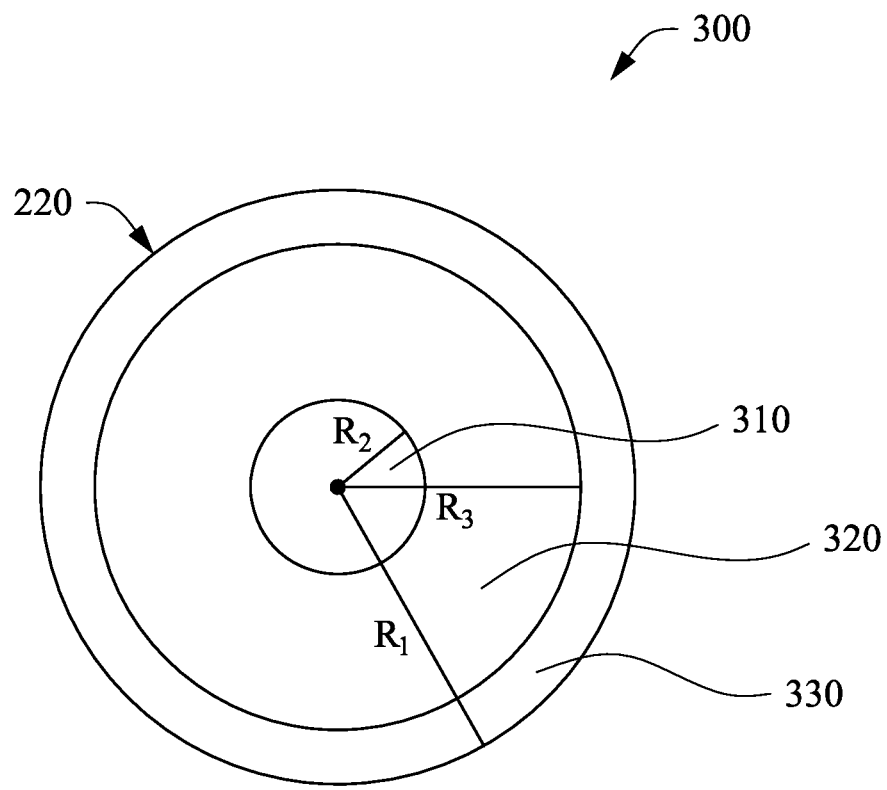
FIG. 3 is a bottom view of a multifunctional shutter disk according to one embodiment of the present disclosure.

FIG. 3 is a bottom view 300 of a multifunction shutter disk 220 according to embodiments of the present disclosure.

As shown in FIG. 3, in one embodiment, the shutter disk 220 has a circular shape and a first side (e.g., a bottom surface illustrated in FIG. 3) of the disk 220. A second side of the shutter disk 220 opposite of the first side may be connected to other parts of the chamber 200. The multifunction shutter disk 220 according to the present disclosure includes at least a thermal energy source module 310 (such as a lamp module 310), a power module 320, and a gas line module 330 on the first side. For example, the shutter disk 220 has a first radius R1. In the embodiment illustrated in FIG. 3, the lamp module 310 is arranged in an area of the bottom surface of disk 220 having a second radius R2. The lamp module 310 is located within an inner circular area defined by the second radius R2. The power module 320 (also referred to as an etch module 320) is arranged adjacent to the lamp module 310. For example, as illustrated in FIG. 3, the power module 320 is arranged in the area outside of the second radius R2 and within the third radius R3. That is, the power module 320 is located within a first outer ring area defined by the area between the third radius R3 and the second radius R2. In accordance with embodiments of the present disclosure, the gas line module 330 is arranged adjacent to the power module 320. The gas line module 330 is arranged in the area outside of the third radius R3 and within the first radius R1. That is, the gas line module 330 may be located within a second outer ring area defined by the area between the third radius R3 and the first radius R1.

In other embodiments, the arrangements of the lamp module 310, the power module 320, and the gas line module 330 can be changed. For example, the power module 320 may be located in the inner circular area, and the gas line module 330 may be located in the first outer ring area, and the lamp module 310 may be located in the second outer ring area. Other various arrangements of the lamp module 310, power module 320 and gas line module 330 may be employed and the arrangements are not necessarily fixated to the embodiments shown in the drawing. In addition, although a shutter disk in accordance with embodiments of the present disclosure has been described as including a lamp module 310, power module 320 and gas line module 330, embodiments of a shutter disk in accordance with the present disclosure may omit one or more of the lamp module 310, power module 320 and gas line module 330.

In one embodiment, the lamp module 310, the power module 320, and the gas line module 330 may be formed integral with the shutter disk 220 and be arranged at the first side in a co-planar manner. In another embodiment, the modules may be removably attached to the first side of the shutter disk 220 and may be attached in a non co-planar manner.

In other embodiments, the lamp module 310, the power module 320, and the gas line module 330 can be arranged at any location at the first side of the shutter disk 220. That is, the modules do not have to be formed in a concentric arrangement as shown in FIG. 3. For example, each of the modules does not have to be disposed in an inner circular area, or a first and second outer ring area, and have circle shapes or ring shapes. In other embodiments, the modules may have different shapes, sizes, and dimensions. For example, the modules may have a polygonal shape (e.g., rectangular shape, triangle shape, or the like) or a shape of a line (e.g., straight line, circular line, or the like) or any other shape suitable for implementation of providing thermal energy, power or gas suitable to carry out the degas function and the pre-clean function. For example, the lamp module 310 may include a single lamp positioned on the first side of the shutter disk 220 or alternatively, a ring configuration that includes several lamps that are spaced along the perimeter of the first side.

In some embodiments, the lamp module 310 and the power module 320 may be implemented as a single module. For example, a single module can be formed to perform both functions of a lamp module and a power module. In these embodiments, the first side of the shutter disk 220 may have a combined, single module with a lamp function and a power function, and a separate gas line module 330. In further embodiments, the modules can be combined to one module depending on the overlapping functions of the modules.

The lamp module 310 is configured to heat the workpiece 215 to a temperature that results in the removal of external moisture during the degas operation (e.g., outgassing). For providing heat, the lamp module 310 may include any suitable heating device suitable to raise the temperature of the workpiece sufficiently to remove external moisture from the surface of the workpiece 215. For example, the lamp module 310 may include an infrared heater, a laser heater, a radiant or convective heater or other wafer heaters to raise the temperature of the workpiece 215. Further examples of the lamp module 310 may include a heater including a heating coil on a surface of the heater facing the workpiece 215. Additionally or alternatively, the heater may include a heating lamp on the surface of the heater facing the workpiece 215. By controlled heating of the workpiece 215 using the lamp module 310, certain gas and moisture present in the workpiece 215 can be removed during the degas process. In accordance with some embodiments, the lamp module 310 includes a cover coating to protect the outer surface of the lamp module 310 and/or the shutter disk 220. The cover coating on the lamp module 310 protects the module when it is directly exposed to plasma during the degas process. Direct exposure to plasma during the degas process may degrade the quality and function of the shutter disk 220. The cover coating may also reduce the frequency of having to clean or replace the shutter disk 220. Examples of materials for cover coatings include but not limited to quartz and other suitable materials for performing the protection function.

The power module 320 is configured to remove oxides, impurities, and foreign external materials during a pre-clean operation. For example, the power module 320 removes impurities from the surface of the workpiece 215 through chemical etching method or physical etching method before further processing is performed on the workpiece 215.

In one embodiment, the power module 320 can be implemented using an RF power source. However, in other embodiments, other power source may be used and the power source is not necessarily limited to an RF power source. For example, a DC power source may be used in the power module 320. To initiate the pre-cleaning process, parameters of the power module 320 may be set that is suitable for cleaning the impurities on the workpiece 215. In some embodiments, additional gas may be supplied through the gas line module 330 in conjunction with applying power source to the workpiece 215. In one example, a fluorine-containing compound gas may be supplied and about 300 to about 2200 [watts: W] of RF power source may be applied. The power source from the power module 320 will form plasma that reacts and cleans the impurities on the workpiece 215. The power level of the power module 320 may be changed during the process to set different power levels after the cleaning process is completed to minimize the reaction with the walls or other structures within the chamber.

In some embodiments, the power module 320 may incorporate RF generators configured to generating RF power with various frequencies. For example, the power module 320 may include a low frequency RF generator and a high frequency RF generator to supply various ranges of power levels and frequencies. In one embodiment, the power module 320 includes RF power generator that is embedded in the shutter disk 220. The RF power generator can provide plasma to clean the workpiece 215.

In one embodiment of the present disclosure, a metal hard mask (MHM) process using TiN is implemented using the multifunctional chamber 200 having the multifunctional shutter disk 220 in accordance with the present embodiment. In the related art, a workpiece is retrieved from a workpiece elevator by a wafer transfer system and put into a degas chamber for removing external moisture from the surface of the workpiece. After being processed in the degas chamber, the wafer transfer system transfers the workpiece from the degas chamber and to a PVD chamber for a deposition process. The transfer time for moving the workpiece from the workpiece elevator to the degas chamber and then to the PVD chamber contributes to the overall processing time for the workpiece which reduces the throughput of the chamber process system. For example, in the related art, the throughput for performing an MHM process is about 50 pieces per hour. In contrast, an MHM process carried out using embodiments of the present disclosure has a throughput for performing an MHM process of about 60 pieces per hour. The greater throughput when performing an MHM process using embodiments of the present disclosure is due to a reduced time spent transferring the workpiece from the workpiece elevator to a separate degas chamber and then to a separate PVD chamber. That is, in accordance with embodiments of the present disclosure, the workpiece 215 is picked up from the workpiece elevator 160 by the wafer transfer system 170 and is placed in the PVD chamber. In the PVD chamber, first a degas operation is performed by utilizing the shutter disk including a lamp module 310 to remove external moisture such as water from the surface of the workpiece 215. After the degas operation, the shutter disk 220 is stored in the enclosure (e.g., the disk will be stored in the enclosure when not in use), and deposition process can be performed in the chamber without the wafer transfer system 170 having to move the workpiece 215 to a separate chamber. That is, within the same chamber, gas (e.g., Ar) will be supplied in the chamber and a plasma state will be formed by applying suitable voltages for creating the plasma state (e.g., an electrically charged gas including electrons and ions that have positive electrical charge). These plasma state particles bombard the target 230 and the materials separated from the target 230 due to the impact is deposited on the workpiece 215. Accordingly, since the transfer time for moving the workpiece 215 from the workpiece elevator 160 to subsequent chambers are eliminated, the throughput of the chamber process system 100 can be increased about 20% compared to the related chamber system in the art. Moreover, the throughput can be further improved in processes that require further processing such as pre-clean process as workpieces processed using the multi-functional chambers and multi-functional shutter disks of the present disclosure do not require transfer to a separate pre-clean chamber, unlike the processing of workpieces in the related chamber system that utilize a pre-clean chamber separate from a degas chamber or a deposition chamber.

In another embodiment, a nickel (Ni) process can be implemented using the multifunctional chamber 200 having the multifunctional shutter disk 220 in accordance with embodiments of the present disclosure. In the related art, a workpiece is picked up from the workpiece elevator by the wafer transfer system and delivered to a pre-clean chamber for removing oxides or impurities by a chemical method from the surface of the workpiece. After being processed in the pre-clean chamber, the wafer transfer system picks up the workpiece from the pre-clean chamber and delivers it to a PVD chamber for the deposition process. The transfer time for moving the workpiece from the workpiece elevator to the pre-clean chamber and to the PVD chamber reduces the throughput of the chamber process system. For example, in the related art, the throughput for performing a Ni process is about 15 pieces per hour. In contrast, a Ni process carried out according to embodiments of the present disclosure utilizing a multifunctional chamber and multifunctional shutter disk exhibits throughput about 25 pieces per hour due to the reduced transfer time involved. That is, utilizing embodiments of the present disclosure, the workpiece 215 is picked up from the workpiece elevator 160 by the wafer transfer system 170 and is placed in the PVD chamber. In the PVD chamber, a chemical pre-clean operation is performed first by utilizing the power module 320 of the shutter disk 220 to chemically clean the surface of the workpiece 215. The gas line module 330 is also used to provide reactive gas such as nitrogen trifluoride ($NF_3$) for the cleaning process. The $NF_3$ gas (or any other suitable gas such as tungsten silicide) is provided through the gas line module 330 and the power module 320 uses $NF_3$ gas in the plasma etching (or plasma cleaning) of the workpiece 215 (e.g., silicon wafers). For example, the power module 320 initially breaks down in situ the $NF_3$ gas by use of plasma. The resulting fluorine atoms are the active cleaning agents that attack, for example, the polysilicon, silicon nitride and silicon oxide present in the workpiece 215. After the pre-clean operation, the shutter disk 220 is stored in the enclosure and deposition process can be performed in the chamber without the wafer transfer system 170 having to move the workpiece 215 to a separate chamber. That is, within the same chamber, the deposition process will be performed on the workpiece 215. Accordingly, since the transfer time for moving the workpiece 215 from the workpiece elevator 160 to subsequent chambers are reduced or eliminated, the throughput of the chamber process system 100 can be increased about 66.6% compared to the related chamber system described above.

In yet another embodiment in accordance with the present disclosure, a TiN process is implemented using the multifunctional chamber 200 having the multifunctional shutter disk 220. In the related art, a workpiece is picked up from the workpiece elevator by the wafer transfer system and is initially put into a degas chamber transferred to a pre-clean chamber then transferred to a PVD chamber and finally transferred to a CVD chamber for TiN processing. That is, in the related chamber system, the workpiece is moved between at least 4 separate chambers (e.g., degas chamber, pre-clean chamber, PVD chamber, and CVD chamber). The transfer time for moving the workpiece from the workpiece elevator to these multiple chambers reduces the throughput of the chamber process system. For example, in the related art, the throughput for performing a TiN process is about 35 pieces per hour. In contrast, a TiN process according to the present disclosure exhibits a throughput of about 46 pieces per hour due to the reduced transfer time. That is, in accordance with the present disclosure, the workpiece 215 is picked up from the workpiece elevator 160 by the wafer transfer system 170, is placed in the PVD chamber and is then moved to the CVD chamber. In the PVD chamber, first a degas operation is performed by utilizing the lamp module 310 of the shutter disk 220 to remove external moisture from the surface of the workpiece 215. Then, secondly, in the same chamber, a physical pre-clean operation is performed by utilizing the power module 320 of the shutter disk 220 to physically clean the surface of the workpiece 215. In the physical pre-clean process, an inert gas such as Ar is used. In some embodiments, the gas line module 330 provides the inert gas for the cleaning process. In other embodiments, the Ar gas may be supplied to the chamber 200 through a gas inlet connected to the chamber 200. A plasma cleaning or plasma etching is used during the process of the physical pre-clean operation. A plasma etching is a form of plasma processing used to clean oxide or other impurities in the surface of the workpiece 215. The plasma source, known as etch species, can be either charged (ions) or neutral (atoms and radicals). The etch species reacts with the materials in the workpiece 215 and etches or cleans the surface of the workpiece 215. Due to its etching properties, plasma etching can also be used to fabricate integrated circuits. After the pre-clean operation, the shutter disk 220 is stored in the enclosure and a PVD deposition process can be performed in the chamber without the wafer transfer system 170 having to move the workpiece 215 to a separate chamber. After the PVD process, then the workpiece 215 is finally transferred to the CVD chamber for CVD processing. Accordingly, since the transfer time for moving the workpiece 215 from the workpiece elevator 160 to subsequent chambers are significantly reduced, the throughput of the chamber process system 100 can be increased about 31.4% compared to the related chamber system in the art.

Figure 4:
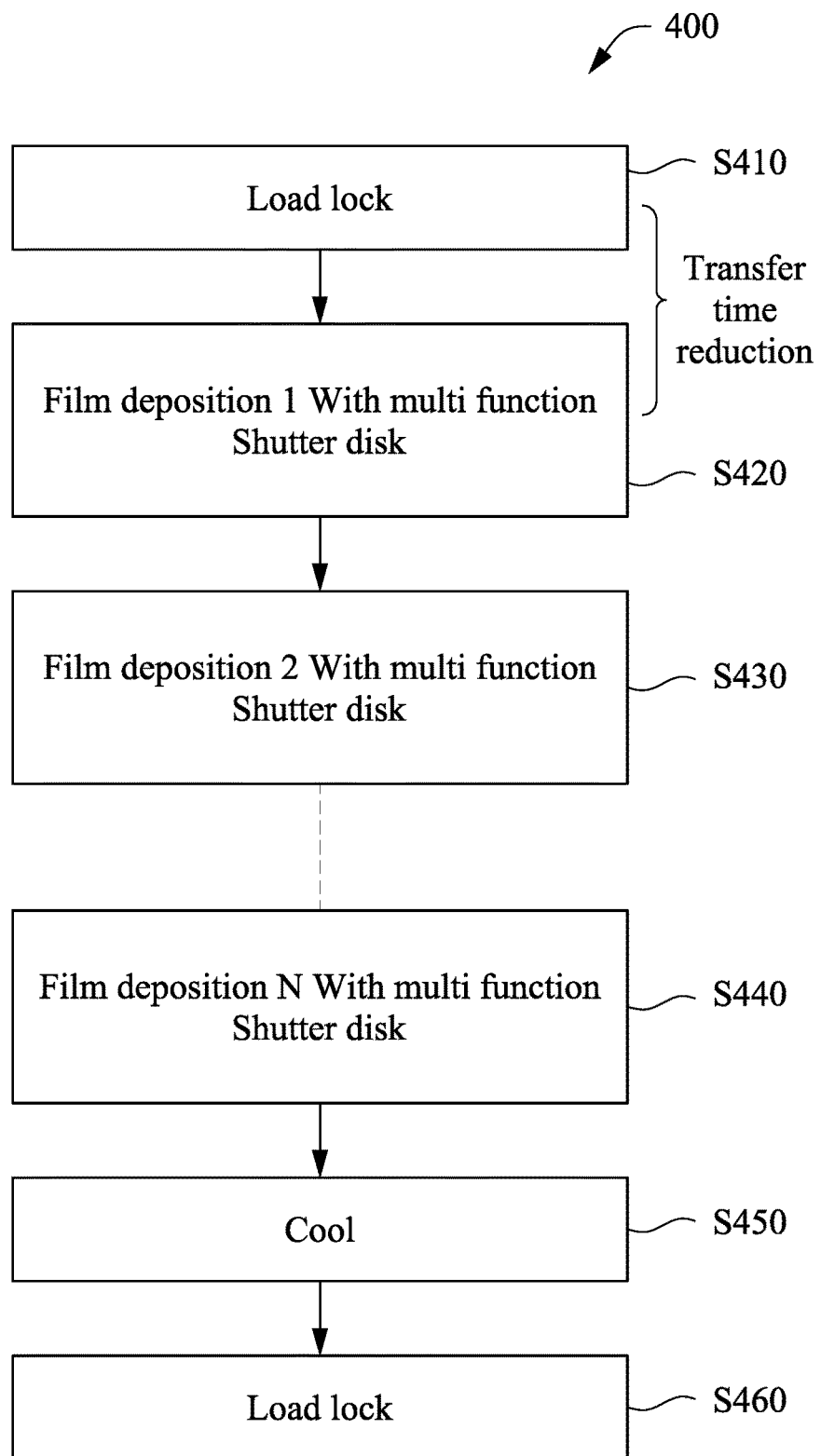
FIG. 4 is a flow chart of a film deposition process according to embodiments of the present disclosure.

FIG. 4 is a flow chart 400 of a process for depositing two films in a chamber system 100 according to embodiments of the present disclosure. At step S410, a plurality of workpieces is stored in a cassette in an external workpiece elevator located adjacent to the chamber process system. At step S420, a workpiece among the plurality of workpieces is selected and delivered to a first chamber having a multifunctional shutter disk for depositing a first film on the workpiece. After the first film is deposited on the workpiece, the steps may continue to step S430, and step S440 depending on how many films will be deposited on the workpiece. The first chamber having a multifunctional shutter disk includes at least a lamp module and a power module to perform the function of the degas operation and the pre-clean operation. The degas operation is performed using the lamp module incorporated in the shutter disk. The pre-clean operation is performed using the power module incorporated in the shutter disk. By including a multifunction shutter disk in each of the chambers, e.g., first chamber for performing a deposition of a first film at step S420, second chamber for performing a deposition of a second film at step S430, nth chamber for performing a deposition of an nth film at step S440, the transfer time involved in moving to a degas chamber for the degas operation and a pre-clean chamber for the pre-clean operation is eliminated. After the film deposition process is performed on the workpiece, the workpiece is moved using a wafer transfer system to a cooling chamber at step S450. After the cooling process, the wafer transfer system moves the workpiece to the external workpiece elevator for further processing.

To illustrate the advantages of a multifunctional chamber having a multifunctional shutter disk formed in accordance with embodiments of the present disclosure, a time estimate of how long each process takes in an example process will be illustrated. It should be understood that the times given below are representative of one related process. Other related processes may have different process times which are less than or greater than the process times described below. In a process utilizing a related system, the transfer time between the external workpiece elevator and a chamber or from one chamber to another chamber is about 30 to 40 seconds. The degassing operation involves about 120 to 130 seconds, and the pre-cleaning operation involves about 150 to 160 seconds. The film deposition of the first film involves about 100 to 110 seconds, and a deposition of a second film involves about 200 to 210 seconds. Further, the time involved in the cooling process is about 60 to 70 seconds.

In a related chamber system, transferring a workpiece from the external workpiece elevator to a degas chamber takes about 30 to 40 seconds. As described above, the degas operation takes about 120 to 130 seconds. The transfer time from the degas chamber to the pre-clean chamber is about 30 to 40 seconds and the pre-clean operation takes about 150 to 160 seconds. After the pre-cleaning process, the transfer of the workpiece to a first film deposition chamber takes about 30 to 40 seconds. The deposition process takes about 100 to 110 seconds. After the first film deposition process in the first chamber, the workpiece is transferred to a second chamber for depositing a second film. This transfer time is about 30 seconds and the deposition of the second film takes about 200 to 210 seconds. Thereafter, another 30 to 40 seconds is required to move the workpiece from the second chamber to the cooling chamber and the cooling process takes about 60 to 70 seconds. After the cooling process is complete, the workpiece is transferred to the workpiece elevator which takes another 30 to 40 seconds. In sum, the total time involved in processing a single workpiece according to this described related process amounts to at least about 810 seconds.

As a contrast to the process described in the previous paragraph using a related chamber system, a similar process using a multifunctional chamber and shutter disk in accordance with the present disclosure is described. A similar process using a multifunctional chamber and shutter disk of the present disclosure moves a workpiece from the workpiece elevator at step S410 to the first chamber. This transfer takes about 30 to 40 seconds. The process at step S420 which involves degassing, pre-cleaning, and depositing a first film on the workpiece, involves a total of about 370 to 380 seconds. That is, as explained previously, the degassing operation involves about 120 to 130 seconds, the pre-cleaning operation involves about 150 to 160 seconds, and the deposition of the first film involves about 100 to 110 seconds. However, in accordance with processes of the present disclosure there is no transfer time involved in moving the workpiece from a degas chamber to a pre-clean chamber and to a first film deposition chamber. After the deposition of the first film, the workpiece is moved from the first chamber to a second chamber at step S430. Here, the deposition of the second film is performed and involves about 200 seconds. Thereafter, at step S450 (in this example, there were only two deposition of films involved) for cooling. That is, about 30 to 40 seconds is used to move the workpiece from the second chamber to the cooling chamber and the cooling process takes about 60 to 70 seconds. After the cooling process is complete, at step S460, the workpiece is transferred to the workpiece elevator which will take another 30 to 40 seconds. In sum, the total time involved in processing a single workpiece in accordance with the schedule described above amounts to at least about 750 seconds. In contrast, the process carried out by the related chamber system described above involves at least about 60 more seconds due to the increased time spent transferring the workpiece from chamber to chamber. This reduction in transferring time contributes to the increase in the throughput rate for the chamber process systems in accordance with embodiments described herein.

A multifunctional shutter disk according to the present disclosure protects the holder (or the workpiece support) just as the related shutter disk and further provides an ability to carry out a degassing process and the pre-cleaning process in the same chamber. By incorporating a multifunctional shutter disk in a film deposition chamber, the chamber process system does not have to move the workpieces from one chamber to another chamber in order to carry out a degassing process, pre-cleaning process and deposition process, but rather can carry out all three processes in a single chamber. Practicing embodiments of the present disclosure will also simplify the types of chambers (e.g., degas chamber, pre-clean chamber, CVD/PVD chamber, cooling chamber, or the like) required during the film deposition process.

One aspect of the multifunctional shutter disk is that it includes a lamp device, a DC/RF power device, and a gas line on one surface of the shutter disk. With this configuration, simplifying the chamber type is possible as the various specific, dedicated chambers such as the aforementioned chambers are not required. For example, by using the multifunctional shutter disk, the degassing function and the pre-cleaning function is provided within a single chamber. To be specific, the CVD chambers or the PVD chambers can simply incorporate the multifunctional shutter disk within the chamber and the degas process and the pre-clean process can be performed within the CVD or PVD chambers. This means that a separate degas chamber and a pre-clean chamber is no longer required. Not needed separate degas and pre-clean chambers has the added benefit of they can be replaced with CVD or PVD chambers, which can contribute positively to the throughput of chamber systems in accordance with the present disclosure.

The present disclosure has several benefits which are not limited to the enumerated benefits. First of all, by combining the degas/pre-clean chamber function in a shutter disk, the throughput can improve significantly. Secondly, because the need for the costly degas chambers and the pre-clean chambers are obviated, the overall manufacturing costs is decreased. Finally, the wafers do not have to be transferred from a degas chamber to a pre-clean chamber, and then to a CVD or PVD chamber. By reducing or eliminating the time involved in transferring wafers to and from chambers, the overall time involved in the film deposition is significantly reduced.

One aspect of the present disclosure provides a film deposition chamber. The film deposition chamber includes an electrode; a holder configured to hold a workpiece; and a shutter disk overlying the holder.

The shutter disk includes: a first side and a second side, the first side of the shutter disk facing the holder; and a thermal energy source on the first side of the shutter disk.

In one embodiment, the shutter disk is between the electrode and the holder.

In one embodiment, the shutter disk has a circular shape with a first radius. The first side includes an inner circular area having a second radius and an outer ring area occupying an area outside of the second radius of the inner circular area and within the first radius of the shutter disk.

In one embodiment, the thermal energy source includes a lamp module within the inner circular area of the first side of the shutter disk.

In one embodiment, the shutter disk further includes an etch module within the outer ring area of the first side of the shutter disk.

In one embodiment, the etch module includes a source of electromagnetic energy suitable for use in at least one of a chemical etching pre-clean process and a physical etching pre-clean process.

In one embodiment, the etch module is connected to a power source. The power source includes a direct current (DC) power or a radio frequency (RF) power.

In one embodiment, the film deposition chamber further includes a gas line connected to the shutter disk for providing at least one of a reactive gas and an inert gas for applying to the workpiece.

Another aspect of the present disclosure provides a multifunctional shutter disk having a first surface and a second surface. The multifunctional shutter disk includes: a lamp module on the first surface of the shutter disk; a power module adjacent to the lamp module on the first surface.

The first surface includes: an inner circle having a first radius, the lamp module occupying at least a portion of the inner circle; and an outer circle concentric with the inner circle, the outer circle having a second radius greater than the first radius, the power module occupying at least a portion of an area between the outer circle and the inner circle.

In one embodiment, the lamp module includes a heater for heating a workpiece.

In one embodiment, the power module includes a source of electromagnetic energy suitable for use in at least one of a chemical etching pre-clean process and a physical etching pre-clean process.

In one embodiment, the lamp module and the power module are coplanar to each other on the first surface.

In one embodiment, the multifunctional shutter disk further includes a gas line for supplying reactive gas suitable for use in the chemical etching pre-clean process and inert gas suitable for use in the physical etching pre-clean process.

Yet another aspect of the present disclosure provides a method. The method includes the steps of providing a workpiece to a multifunctional chamber where degassing of the workpiece, pre-cleaning of the workpiece, and deposition of film onto the workpiece occur; placing the workpiece on a holder within the chamber and below a multifunctional shutter disk; activating a source of thermal energy on the multifunctional shutter disk; degassing the workpiece; and depositing a film on the workpiece.

In one embodiment, the method further includes the steps of activating a power module on the multifunctional shutter disk; etching material from the workpiece using a physical etching method powered by the power module.

In one embodiment, the method further includes the step of activating a power module of the multifunctional shutter disk to clean the workpiece with a chemical etching method after degassing the workpiece.

In one embodiment, etching material from the workpiece using the physical etching method includes: supplying inert gas into the chamber; applying electromagnetic power towards the workpiece using the power module to provide a suitable energy level for creating a plasma state of the inert gas; and cleaning a surface of the workpiece using the inert gas at the plasma state.

In one embodiment, wherein etching material from the workpiece using chemical etching method includes: supplying reactive gas into the chamber; applying electromagnetic power towards the workpiece using the power module to provide a suitable energy level for creating a plasma state of the reactive gas; and cleaning a surface of the workpiece using the reactive gas at the plasma state.

In one embodiment, the method further includes: removing the workpiece from the chamber; and placing the workpiece to a separate chamber for cooling the workpiece.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A film deposition chamber, comprising:
an electrode;
a holder configured to hold a workpiece; and
a shutter disk overlying the holder, the shutter disk including:
a first side and a second side, the first side of the shutter disk facing the holder; and
a thermal energy source on the first side of the shutter disk,
wherein the shutter disk has a circular shape with a first radius, the first side including an inner circular area having a second radius and an outer ring area occupying an area outside of the second radius of the inner circular area and within the first radius of the shutter disk.

2. The film deposition chamber of claim 1, wherein the thermal energy source includes a lamp module within the inner circular area of the first side of the shutter disk.

3. The film deposition chamber of claim 2, wherein the shutter disk further includes an etch module within the outer ring area of the first side of the shutter disk.

4. The film deposition chamber of claim 3, wherein the etch module includes a source of electromagnetic energy suitable for use in at least one of a chemical etching pre-clean process and a physical etching pre-clean process.

5. The film deposition chamber of claim 4, wherein the etch module is connected to a power source.

6. The film deposition chamber of claim 5, wherein the power source includes a direct current (DC) power or a radio frequency (RF) power.

7. The film deposition chamber of claim 4, further comprising:
a gas line connected to the shutter disk for providing at least one of a reactive gas and an inert gas for applying to the workpiece.

8. The film deposition chamber of claim 1, wherein the shutter disk is between the electrode and the holder.

9. A film deposition chamber, comprising:
an electrode;
a holder configured to hold a workpiece; and
a shutter disk overlying the holder, the shutter disk having a first surface and a second surface, comprising:
a lamp module on the first surface of the shutter disk; and
a power module adjacent to the lamp module on the first surface,
wherein the first surface including:
an inner circle having a first radius, the lamp module occupying at least a portion of the inner circle; and
an outer circle concentric with the inner circle, the outer circle having a second radius greater than the first radius, the power module occupying at least a portion of an area between the outer circle and the inner circle.

10. The film deposition chamber of claim 9, wherein the power module includes a source of electromagnetic energy suitable for use in at least one of a chemical etching pre-clean process and a physical etching pre-clean process.

11. The film deposition chamber of claim 10, wherein the lamp module and the power module are coplanar to each other on the first surface.

12. The film deposition chamber of claim 10, further comprising:
a gas line for supplying reactive gas suitable for use in the chemical etching pre-clean process and inert gas suitable for use in the physical etching pre-clean process.

13. The film deposition chamber of claim 9, wherein the lamp module includes a heater to heat a workpiece.

14. The film deposition chamber of claim 1, wherein the shutter disk is movable from a position overlying the holder.

15. A film deposition chamber, comprising:
an electrode;
a holder configured to hold a workpiece; and
a shutter disk overlying the holder, the shutter disk comprising:
a first surface of the shutter disk;
a lamp module on the first surface of the shutter disk; and
a power module adjacent to the lamp module on the first surface,
wherein the first surface includes:
a first section occupied by the lamp module; and
a second section adjacent to the first section occupied by the power module.

16. The film deposition chamber of claim 15, further comprising:
a gas supply module adjacent to the power module on the first surface, the gas supply module being configured to supply reactive gas suitable for use in the chemical etching pre-clean process and inert gas suitable for use in the physical etching pre-clean process.

17. The film deposition chamber of claim 16, wherein the first surface includes a third section adjacent to the first section and the second section occupied by the gas supply module.

18. The film deposition chamber of claim 17, wherein the shutter disk is a substantially circular shape and the first surface of the shutter disk includes a circular contour, the second section includes a circular area having a first radius, the third section includes a ring shaped area that surrounds the second section, the first section includes a ring shaped area that surrounds the third section.

19. The film deposition chamber of claim 17, wherein the shutter disk is a substantially circular shape and the first surface of the shutter disk includes a circular contour, the second section includes a circular area having a first radius, the second section includes a ring shaped area that surrounds the first section, the third section includes a ring shaped area that surrounds the second section.

20. The film deposition chamber of claim 17, wherein the shutter disk is a substantially circular shape and the first surface of the shutter disk includes a circular contour, the third section includes a circular area having a first radius, the second section includes a ring shaped area that surrounds the third section, the second section includes a ring shaped area that surrounds the third section.

* * * * *